United States Patent
Tu et al.

(10) Patent No.: US 9,261,540 B2
(45) Date of Patent: Feb. 16, 2016

(54) DEVICES FOR MEASURING VOLTAGE OF A POWER SUPPLY, DETECTION DEVICES, AND TEMPERATURE CONTROLLERS

(71) Applicant: Emerson Electric Co., St. Louis, MO (US)

(72) Inventors: Lihui Tu, Xi'an (CN); Liang Cao, Xi'an (CN); Cuikun Chu, Xi'an (CN)

(73) Assignee: Emerson Electric Co., St. Louis, MO (US)

( * ) Notice: Subject to any disclaimer, the term of this patent is extended or adjusted under 35 U.S.C. 154(b) by 140 days.

(21) Appl. No.: 14/153,334

(22) Filed: Jan. 13, 2014

(65) Prior Publication Data

US 2014/0285222 A1 Sep. 25, 2014

(30) Foreign Application Priority Data

Mar. 22, 2013 (CN) .......................... 2013 1 0095342
Mar. 22, 2013 (CN) ....................... 2013 2 0134952 U

(51) Int. Cl.
G01R 27/26 (2006.01)
G01R 19/32 (2006.01)
G01R 19/25 (2006.01)

(52) U.S. Cl.
CPC .................... G01R 19/2503 (2013.01)

(58) Field of Classification Search
CPC .............................. G01R 19/32; G01R 27/26
USPC ................................................ 324/658, 679
See application file for complete search history.

(56) References Cited

U.S. PATENT DOCUMENTS

| | | | |
|---|---|---|---|
| 4,107,667 A | 8/1978 | Kronlage | |
| 4,125,023 A | 11/1978 | Amemiya et al. | |
| 4,327,985 A | 5/1982 | Urushihara et al. | |
| 4,335,847 A | 6/1982 | Levine | |
| 5,883,497 A | 3/1999 | Turnbull | |
| 2012/0161792 A1* | 6/2012 | Ikeda | G01R 27/2605 324/658 |
| 2012/0268080 A1* | 10/2012 | Jeon | G06F 1/263 320/167 |
| 2013/0176037 A1* | 7/2013 | Waki | G01R 27/2605 324/658 |

OTHER PUBLICATIONS

"An Automatic DC Current Comparator Resistance Bridge", Duane Brown•, Jun. 2000; 5 pgs.
TI MSP430f413, Mixed Signal Microcontroller, Texas Instruments; May 2001; 64 pgs.
Ti MSP430x41x, Mixed Signal Microcontroller, Texas Instruments; May 2001; 1 pg.
Texas Instruments Battery Management Solutions; www.ti.com/battery; 2012; 25 pgs.
Texas Instruments; SLAA129B Application Report; "Implementing an Ultralow-Power Thermostat with Slope A/D Conversion"; Keith Wuiring•, Jan. 2006; 18 pgs.

* cited by examiner

*Primary Examiner* — Tung X Nguyen
*Assistant Examiner* — Neel Shah
(74) *Attorney, Agent, or Firm* — Harness, Dickey & Pierce, P.L.C.

(57) ABSTRACT

Disclosed are exemplary embodiments of devices for measuring voltage of a power supply. Also disclosed are exemplary embodiments of detection devices and temperature controllers comprising such devices for measuring voltage of a power supply. In exemplary embodiments, a device for measuring the voltage of a power supply generally includes a resistor, a capacitor, and a control unit. One end of the capacitor is connected with the resistor, while the other end of the capacitor is connected to ground. The control unit is connected with the power supply. The control unit includes a comparator connected with the capacitor, a reference power supply connected with the comparator, a timer, and a computing unit.

10 Claims, 11 Drawing Sheets

DEVICES FOR MEASURING VOLTAGE OF A POWER SUPPLY, DETECTION DEVICES, AND TEMPERATURE CONTROLLERS

CROSS-REFERENCE TO RELATED APPLICATIONS

This application claims the benefit and priority of Chinese Patent of Invention Application No. 201310095342.1 filed Mar. 22, 2013, and Chinese Utility Model Application No. 201320134952.3 filed Mar. 22, 2013. The entire disclosures of the above applications are incorporated herein by reference.

FIELD

The present disclosure relates to devices for measuring voltage of a power supply. The present disclosure also relates to detection devices and temperature controllers comprising such devices for measuring voltage of a power supply.

BACKGROUND

This section provides background information related to the present disclosure which is not necessarily prior art.

With the development of chip technology, the cost has become increasingly lower, while performance is getting better or stronger. These improvements have allowed chips to be applied in various fields everywhere, such as in electric machine control, consumer electronics, game devices, industrial control and automation, and major/white household appliances, etc.

FIG. 1 shows a unit inside a chip. The unit can be applied on a controlling device, such as a temperature controller. The unit comprises a temperature measurement module 11 and a supply voltage indicator 12, which are regarded as different modules to fulfill different functions. The temperature measurement module 11 is used for measuring the temperature. The supply voltage indicator 12 is used for detecting the voltage of the power supply.

Conventionally, the components for the supply voltage indicator 12 are integrated inside the chip, such that it occupies more resources inside the chip. This conventional configuration cannot ensure that the chips will have good performance. Also, the cost of the chip equipped with the power supply voltage indicator is high, and thus not conducive to production and sales. Therefore, there is a need to improve the performance of the prior unit, to reduce cost and ensure versatility.

SUMMARY

This section provides a general summary of the disclosure, and is not a comprehensive disclosure of its full scope or all of its features.

Disclosed are exemplary embodiments of devices for measuring voltage of a power supply. Also disclosed are exemplary embodiments of detection devices and temperature controllers comprising such devices for measuring voltage of a power supply.

In exemplary embodiments, a device for measuring the voltage of a power supply generally includes a resistor, a capacitor, and a control unit. One end of the capacitor is connected with the resistor, while the other end of the capacitor is connected to ground. The control unit is connected with the power supply. The control unit includes a comparator connected with the capacitor, a reference power supply connected with the comparator, a timer, and a computing unit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1:
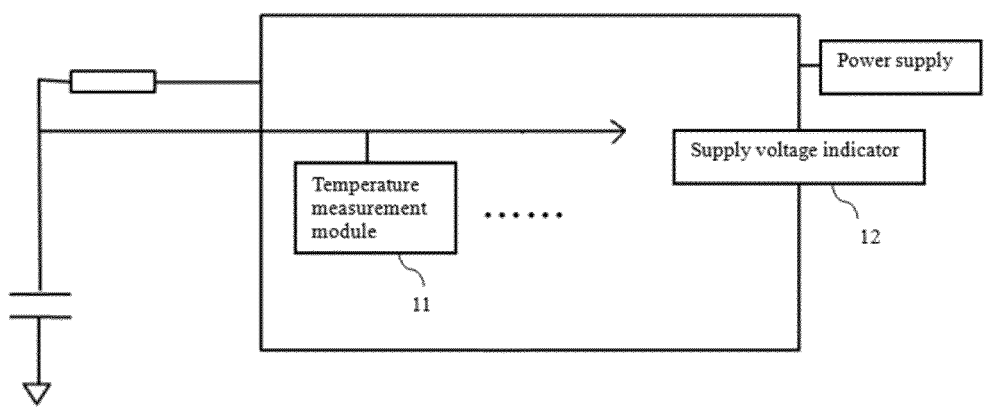
FIG. 1 illustrates a prior art device.

Example embodiments will now be described more fully with reference to the accompanying drawings.

Disclosed are exemplary embodiments of devices for measuring voltage of a power supply. Also disclosed are exemplary embodiments of detection devices and temperature controllers comprising such devices for measuring voltage of a power supply. Exemplary embodiments of the device for measuring voltage of a power supply may allow a module inside a chip to calculate temperature and voltage, where the device may have a relatively simple structure, a relatively low cost, and be operable for achieving a variety of functions in the module.

In exemplary embodiments, a device for measuring voltage of a power supply generally includes a resistor, a capacitor, and a control unit. The resistor is connected with a power supply. A first or one end of the capacitor is connected with the resistor. The other or second end of the capacitor is connected to ground. The control unit is connected with the power supply. The control unit includes a comparator connected with the capacitor, a reference power supply connected with the comparator, a timer, and a computing unit.

The timer is operable for measuring the time interval between the time when the voltage of the capacitor begins to discharge after being fully charged and the time when the voltage across the capacitor is equal to the voltage of the reference power supply. The computing unit is operable for calculating the voltage of the power supply based on the time interval, the voltage of the reference power supply, the resistance of the resistor, and the capacitance of the capacitor.

The computing unit calculates the voltage of the power supply based on the equation (1) below:

$$Ez=Vcc*\text{EXP}(-t/RC) \quad (1)$$

where:
Ez is the voltage of the reference power supply;
Vcc is the voltage of the power supply;
t is the time interval;
R is the resistance of the resistor; and
C is the capacitance of the capacitor.

The reference power supply includes an absolute reference power supply and a relative reference power supply. The control unit controls the comparator to connect to either the absolute reference power supply or the relative reference power supply such that; when the control unit controls the comparator to connect to the relative reference power supply, the timer measures a first time interval between the time when the voltage of the capacitor begins to discharge and the time when the voltage across the capacitor is equal to the voltage of the relative reference power supply; or when the control unit controls the comparator to connect to the absolute reference power supply, the timer measures a second time interval between the time when the voltage of the capacitor begins to discharge and the time when the voltage across the capacitor is equal to the voltage of the absolute reference power supply. The computing unit calculates the voltage of the power supply based on the first time interval, the second time interval, and the voltage of the absolute reference power supply.

When the control unit controls the comparator to connect to the relative reference power supply, the voltage of the power supply is a multiple of the voltage of the relative reference power supply, such that:

$$Vcc=aVcc/\text{EXP}(-t1/RC); \text{ where } a \text{ is a constant and } 0<a<1 \quad (2)$$

therefore, $$RC=t1/\ln(a) \quad (3)$$

when the control unit controls the comparator to connect to the absolute reference power supply, the voltage of the reference power supply is:

$$Ez=Vcc*\text{EXP}(-t2/RC), \quad (4)$$

Substituting (3) into (4), the voltage of the power supply is:

$$Vcc=Ez/\text{EXP}(t2*\ln(a)/t1); \quad (5)$$

where:
Ez is the voltage of the absolute reference power supply;
Vcc is the voltage of the power supply;
t1 is the first time interval;
t2 is the second time interval;
R is the resistance of the resistor; and
C is the capacitance of the capacitor.

The first time interval and the second time interval are acquired in two sequential cycles during which the capacitor discharges.

Exemplary embodiments of the present disclosure also provide detection devices comprising any of the above devices for measuring the voltage of a power supply. The detection device further comprises a chip within which there is a thermometric component. The thermometric component may detect the temperature of the chip. The computing unit calculates the voltage of the absolute reference power supply based on the value of the temperature.

Exemplary embodiments of the present disclosure also provide detection devices for measuring voltage and temperature. The detection device includes the device above and a thermistor connected to the capacitor in any device above.

When the capacitor is fully charged and begins to discharge, the control unit of any device above controls the capacitor to discharge through the resistor or the thermistor. Thus, the control unit measures the voltage of the power supply or the temperature of outside environment.

When the capacitor is fully charged and begins to discharge and the control unit controls the capacitor to discharge through the resistor, the timer measures a third time interval between the time when the capacitor begins to discharge after being fully charged and the time when the voltage across the capacitor is equal to the voltage of the reference power supply. When the capacitor is fully charged and begins to discharge and the control unit controls the capacitor to discharge through the thermistor, the timer measures a fourth time interval between the time when the capacitor begins to discharge after being fully charged and the time when the voltage across the capacitor is equal to the voltage of the reference power supply.

The computing unit calculates the resistance of the thermistor based on the third time interval, the fourth time interval, and the resistance of the resistor. The computing unit further determines the temperature of outside environment based on the resistance of the thermistor.

The computing unit of the detection device for measuring voltage and temperature calculates the voltage of the absolute reference power supply based on the value of the temperature.

Exemplary embodiments of the present disclosure further provide a temperature controller comprising a device above.

According to a first aspect of the present disclosure, there is provided a device for measuring the voltage of a power supply. One or more embodiments of this disclosure is applicable to a variety of chips. Such chips may not keep a separate supply voltage indicator to measure the voltage of the power supply. But the voltage of the power supply may be detected by means of a resistor, a capacitor, and a control unit in a module inside the chips as disclosed herein. The control unit comprises a comparator, a reference power supply, a timer, and a computing unit. The timer measures a time interval between the time when the voltage of the capacitor begins to discharge after being fully charged and the time when the voltage across the capacitor is equal to the voltage of the reference power supply. The computing unit calculates the voltage of the power supply based on the time interval, the voltage of the reference power supply, the resistance of the resistor, and the capacitance of the capacitor.

According to a second aspect of the present disclosure, there is provided another device for measuring the voltage of a power supply. In one or more embodiments of the disclosure, the reference power supply of the device comprises an absolute reference power supply and a relative reference power supply. The control unit controls the comparator to connect to the relative reference power supply. The timer measures a first time interval between the time when the voltage of the capacitor begins to discharge after being fully charged and the time when the voltage across the capacitor is equal to the voltage of the relative reference power supply.

The timer also measures a second time interval in the same way. The computing unit calculates the voltage of the power supply based on the first time interval, the second time interval, and the voltage of the absolute reference power supply. The computing unit can avoid using the resistance of resistor and the capacitance of the capacitor to calculate the voltage of the power supply.

The control unit can control the timer to measure the first time interval and the second time interval in a discontinuous charging and discharging process of the capacitor. This can avoid the timer timing frequently.

In addition, the timer can also measure the first time interval and the second time interval in a continuous charging and discharging process of the capacitor. This can make the calculated value of the voltage more accurate.

According to a third aspect of the present disclosure, there is provided a detection device for measuring temperature. One or more embodiments of the disclosure comprise a thermometric component inside a chip. The thermometric component can detect the temperature of the chip. The computing unit can calculate the voltage of the absolute reference power supply based on the temperature of the chip without using much resources inside the chip. When the detection device is applied to a temperature controller, the computing unit can calculate the voltage of the absolute reference power supply based on the temperature of the outside environment.

According to a fourth aspect of the present disclosure, there is provided a detection device for measuring voltage and temperature. One or more embodiments of this disclosure can detect the temperature of the outside environment and detect the voltage of the power supply. The detection device includes a thermistor. When the control unit controls the capacitor to discharge through the resistor, the timer measures a third time interval between the time when the capacitor begins to discharge after being fully charged and the time when the voltage across the capacitor is equal to the voltage of the reference power supply. At this time, the computing unit can work out the voltage of the power supply. When the control unit controls the capacitor to discharge through the thermistor, the timer measures a fourth time interval in the same way. The computing unit calculates the resistance of the thermistor based on the third time interval, the fourth time interval, and the resistance of the resistor. The computing unit then determines the temperature of outside environment based on the resistance of the thermistor. Further, the computing unit can calculate the voltage of the absolute reference power supply based on the temperature of the outside environment.

According to a fifth aspect of the present disclosure, there is provided a temperature controller. One or more embodiments of this disclosure can avail a module for measuring temperature to fulfill the function of measuring both temperature and voltage. It can help ensure features of the chip's normal operation and avoid occupying more resources inside the chip.

Accordingly, exemplary embodiments of the present disclosure provide devices for measuring the voltage of a power supply. The device may be applicable to chips that don't have a dedicated supply voltage indicator to measure the voltage of the power supply, as the device may be used to determine the voltage of the power supply in the circuit. More specifically, the device for measuring the voltage of the power supply can calculate the voltage of the power supply by means of a comparator on another module inside the chip and some related components existing in the circuit.

Figure 2:
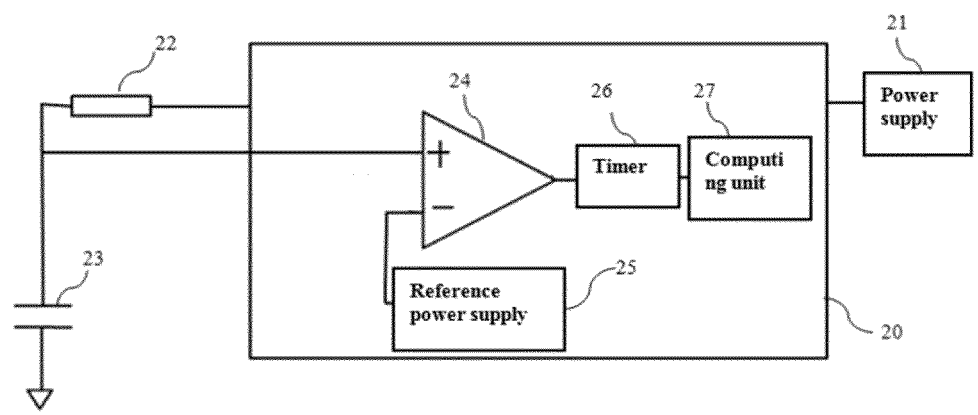
FIG. 2 illustrates a device for measuring voltage of a power supply according to an exemplary embodiment of the present disclosure.

With reference now to the figures, FIG. 2 shows an exemplary embodiment of a device for measuring voltage of a power supply embodying one or more aspects of the present disclosure. As shown in FIG. 2, the device includes a control unit 20, a resistor 22, and a capacitor 23. The resistor 22 is connected with a power supply 21. One end of the capacitor 23 is connected with the resistor 22. The other end of the capacitor 23 is connected to ground. The control unit 20 is connected with the power supply 21. The control unit 20 includes a comparator 24 connected with the capacitor 23, a reference power supply 25 connected with the comparator 24, a timer 26, and a computing unit 27.

The timer 26 can measure the time interval between the time when the voltage of the capacitor 23 begins to discharge after being fully charged and the time when the voltage across the capacitor 23 equals the voltage of the reference power supply 25. The comparator 24 can send a signal to indicate that the voltage of the capacitor 23 equals the voltage of the reference power supply 25. The computing unit 27 calculates the voltage of the power supply 21 based on the time interval, the voltage of the reference power supply 25, the resistance of the resistor 22, and capacitance of the capacitor 23.

With this exemplary embodiment of the device, it is not necessary to use a dedicated device for detecting the voltage of the power supply 21. The computing unit 27 can calculate the voltage of the power supply 21 based on the time interval, the voltage of the reference power supply 25, the resistance of the resistor 22, and capacitance of the capacitor 23.

Specifically, in the process of charging and discharging of the capacitor 23, when the capacitor 23 begins to discharge after being fully charged, the timer 26 begins timing. The comparator 24 compares the voltage across the capacitor 23 while discharging with the voltage of the reference power supply 25. When the voltage across the capacitor 23 reduces to the value which is equal to the voltage of the reference power supply 25, the comparator 24 sends a signal to the timer 26, and the timer 26 stops timing, and thereby provides a time interval t. The computing unit 27 of the control unit 20 calculates the voltage of the power supply 21 based on the voltage of the reference power supply 25, the time interval t, the resistance of the resistor 22, and the capacitance of the capacitor 23.

Figure 3:
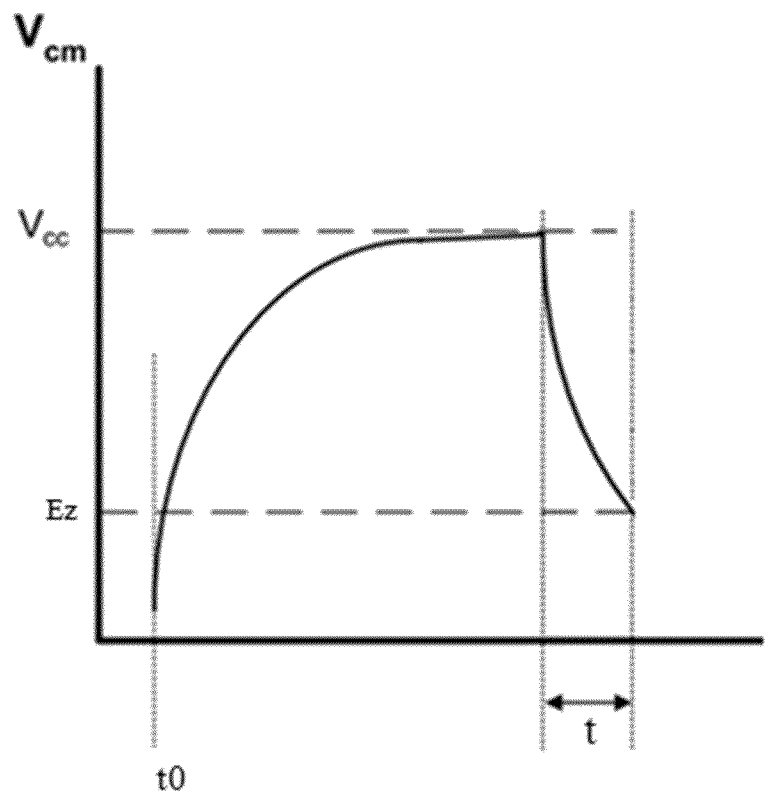
FIG. 3 illustrates a waveform graph of charging and discharging of the capacitor of the device shown in FIG. 2.

FIG. 3 shows a charging and discharging wave form of the capacitor 23 of the device shown in FIG. 2. The capacitor 23 starts to charge at the time of t0 and then starts to discharge when it is fully charged. At this time, the timer 26 starts timing. When the voltage across the capacitor 23 reduces to the value which is equal to the voltage of the reference power supply 25, the timer 26 records the time interval t.

Assuming that Vcc is the voltage of the power supply 21, Ez is the voltage of the reference power supply 25, and t is the time interval recorded by the timer 26, then the computing unit 27 calculates the voltage of the power supply 21 by the formula or equation (7) below, which is obtained from the formula (1) also set forth below:

$$Ez = Vcc * \text{EXP}(-t/RC) \quad (1)$$

$$Vcc = Ez / \text{EXP}(-t/RC) \quad (7)$$

where:
Ez is the voltage of the reference power supply;
Vcc is the voltage of the power supply;
t is the time interval;
R is the resistance of the resistor; and
C is the capacitance of the capacitor.

The device of this exemplary embodiment may thus obtain the voltage of the power supply by means of the above equation. Thus, the device does not need to rely on or use a dedicated power supply voltage indicator, and thereby avoids occupying a lot more resources of the chip. The device may also have a lower cost.

Figure 4:
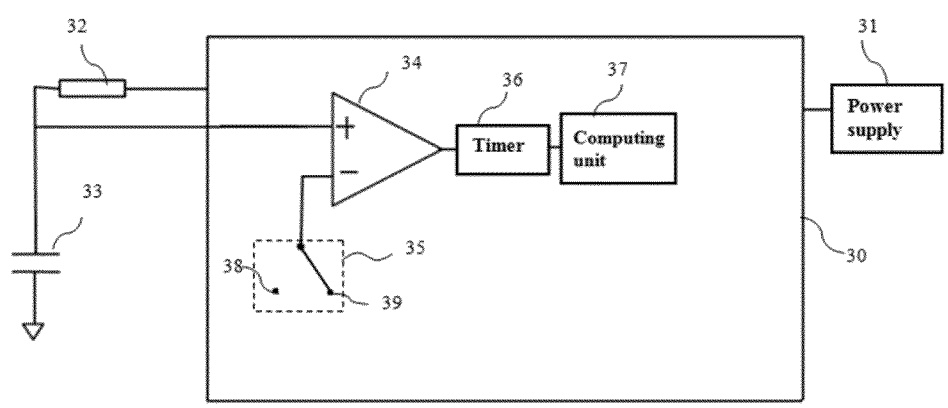
FIG. 4 illustrates a device for measuring voltage of a power supply according to another exemplary embodiment of the present disclosure.

FIG. 4 shows another exemplary embodiment of a device for measuring voltage of a power supply embodying one or more aspects of the present disclosure. As shown in FIG. 4, the device includes a resistor 32, a capacitor 33, and a control unit 30. The resistor 32 is connected with a power supply 31. One end of the capacitor 33 is connected with the resistor 32. The other end of the capacitor 33 is connected to ground. The control unit 30 is connected with the power supply 31. The control unit 30 includes a comparator 34 connected with the capacitor 33, a reference power supply connected with the comparator 34, a timer 36, and a computing unit 37.

The reference power supply comprises an absolute reference power supply 38 and a relative reference power supply 39. The control unit 30 controls the comparator 34 via a switch 35 to connect to either the absolute reference power supply 38 or the relative reference power supply 39.

When the control unit 30 controls the comparator 34 to connect to the relative reference power supply 39 by the switch 35, the capacitor 33 starts to discharge after it is fully charged and the timer 36 begins timing. When the comparator 34 detects that the voltage across the capacitor 33 is equal to the voltage of the relative reference power supply 39, the timer 36 records the first time interval t1.

Further, the voltage of the relative reference power supply 39 can be produced by a resistor assembly. In which case, the resistor assembly is formed by a plurality of resistors in series. Assuming the resistor assembly includes n resistors each having the same resistance, the resistors connect with the power supply, where the comparator 34 connects the first resistor of the resistor assembly, then the voltage of the relative reference power supply 39 is 1/n times of the voltage of the power supply, and it is assumed that a=1/n where a is a constant and 0<a<1. Thus, according to the formula (1), the following formula or equation (2) can be obtained:

$$Vcc=aVcc/\text{EXP}(-t1/RC) \text{ where } a \text{ is a constant and } 0<a<1 \qquad (2)$$

Further, the formula or equation (3) can be calculated as:

$$RC=t1/\ln(a) \qquad (3)$$

When the control unit 30 controls the comparator 34 to connect to the absolute reference power supply 38 by the switch 35, the timer 36 measures a second time interval t2 between the time when the capacitor 33 begins to discharge after being fully charged and the time when the voltage across the capacitor 33 is equal to the voltage of the absolute reference power supply 38.

The absolute reference power supply 38 can connect with the comparator 34 by a port on a chip. The voltage Ez of the absolute reference power supply 38 is known according to the formula (1):

$$Vcc=Ez/\text{EXP}(-t2/RC) \qquad (4)$$

Formula (3) may be combined with formula or equation (4), such that the computing unit 37 can calculate the voltage of the power supply 31 by formula or equation (5) below:

$$Vcc=Ez/\text{EXP}(-t2*\ln(a)/t1) \qquad (5)$$

The resistor assembly in this example may include four resistors. In which case, the voltage of the relative reference power supply 39 is 0.25 times the voltage of the power supply 31. Thus, $0.25Vcc=Vcc*\text{EXP}(-t1/RC)$ according to the formula (1). Further, $RC=t1/\ln(0.25)$ according to the formula (3). And, according to formula (5), voltage of the power supply 31 can be calculated as follows:

$$Vcc=Ez/\text{EXP}(t2*\ln(0.25)/t1) \qquad (6)$$

In order to further reduce the logarithmic computing in the formula or equation (6), the value of $t2*\ln(0.25)/t1$ may be calculated first, and then the logarithmic computing may be calculated by means of table-lookup. The value of $\text{EXP}(t2*\ln(0.25)/t1)$ is calculated to allow the value of the power supply 31 to be obtained. This will not occupy much resources inside the chip.

Figure 5:
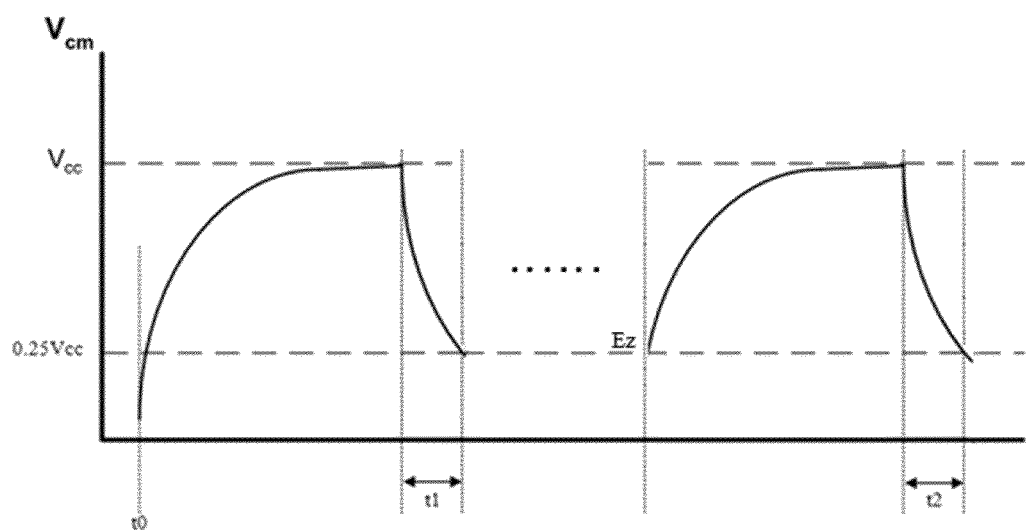
FIGS. 5 and 6 illustrate waveform figure graphs of charging and discharging of the capacitor of the device shown in FIG. 4.

From formula (5) and formula (6) and when the reference power supply comprises an absolute reference power supply 38, the relative reference power supply 39, and the switch 35 (as shown in FIG. 5), the computing unit 37 can calculate the voltage of the power supply 31 only by means of the voltage of the absolute reference power supply 38, the first time interval the timer 36 recorded when the switch 35 connects the relative reference power supply 39, and the second time interval the timer 36 recorded when the switch 35 connects the absolute reference power supply 38. Due to the formula (5) including the logarithmic computing, a proper quantity of the resistors in the resistor assembly can be determined or set to make the logarithmic computing easier.

In addition, the first time interval and the second first time interval mentioned above can be recorded in two non-continuous charging and discharging processes of the capacitor 33.

FIG. 5 shows a waveform of the first time interval and the second time interval which is produced in two non-continuous charging and discharging processes of the capacitor 33. In this example, it is assumed that the voltage of the relative reference power supply is 0.25Vcc. At the time of t0, the capacitor 33 begins to charge. The timer 36 begins timing when the capacitor 33 begins to discharge after it is fully charged. When the comparator 34 detects that the voltage of the capacitor 33 reduces to the value which is equal to the voltage of the relative reference power supply 39, the comparator 34 sends a signal to the timer 36. In response, the timer 36 stops timing, and the first time interval t1 is recorded. After several charging and discharging cycles and when the control unit 30 controls the switch 35 to connect to the absolute reference power supply 38 in a charging and discharging process of the capacitor 33, the timer 36 begins timing at the time that the capacitor 33 is fully charged and begins to discharge. The second time interval t2 is recorded after the voltage across the capacitor 33 reduces to the voltage of the absolute reference power supply 38.

Optionally, the first time interval and the second first time interval mentioned above can also be recorded in two continuous charging and discharging processes of the capacitor.

Figure 6:
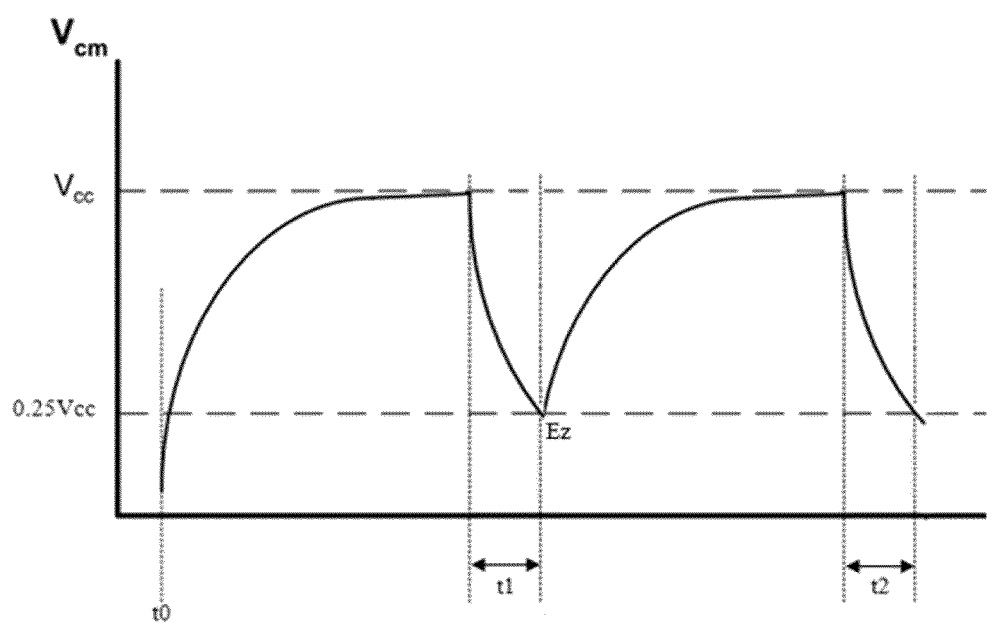

FIG. 6 shows a time waveform of the capacitor 33 in its charging and discharging process when the switch 35 connects to the relative reference power supply 39. For this example, it is assumed that the voltage of the relative reference power supply 39 is 0.25Vcc. At the time of t0, the capacitor 33 begins to charge. When the capacitor 33 is fully charged and begins to discharge, the timer 36 begins timing until the comparator 34 detects that the voltage across the capacitor 33 reduces to the value which is equal to the voltage of the relative reference power supply 39. The comparator 34 then sends a signal to the timer 36. In response, the timer 36 stops timing, and the first time interval t1 is recorded. In the next charging and discharging process of the capacitor 33, the control unit 30 controls the switch 35 to connect to the absolute reference power supply 38. The timer 36 begins timing when the capacitor 33 is fully charged and begins to discharge. The second time interval t2 is recorded after the voltage across the capacitor 33 reduces to the voltage value of the absolute reference power supply 38.

In this exemplary embodiment, the computing unit 37 calculates the voltage of the power supply 31 only by means of the first time interval t1, the second time interval t2, and the voltage of the absolute reference power supply 38. It can avoid using the value of the resistor(s) 32 and the value of the capacitor 33 to calculate the voltage of the power supply 31, which helps to reduce errors and make the voltage value of the power supply 31 more accurate.

Figure 7:
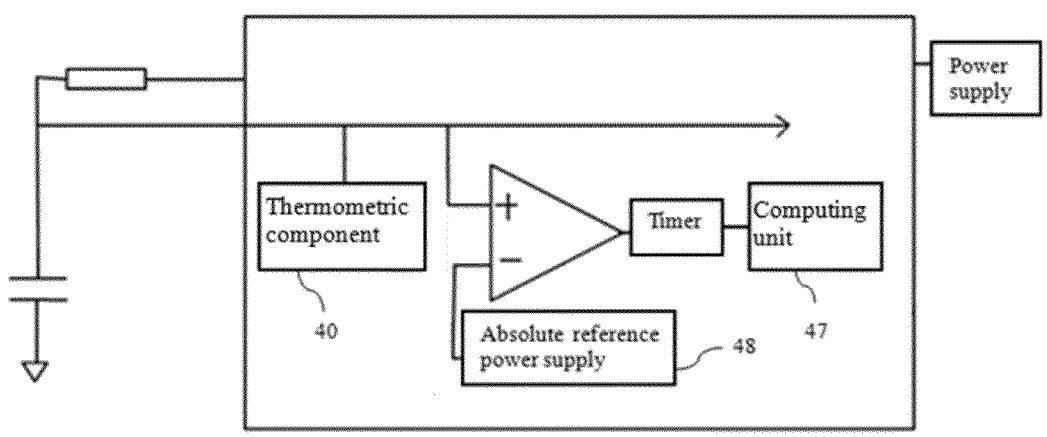
FIG. 7 illustrates a detection device that includes the device for measuring voltage of a power supply shown in FIG. 2 or FIG. 4, where the detection device further includes a thermometric component that can detect temperature of the chip according to another exemplary embodiment of the present disclosure.

FIG. 7 illustrates an exemplary embodiment of a detection device embodying one or more aspects of the present disclosure. In this exemplary embodiment, the detection device may include similar components as the device for measuring voltage of a power supply as shown in FIG. 2 or FIG. 4.

As shown in FIG. 7, the detection device further includes a chip having a thermometric component 40. The thermometric component 40 can detect the temperature of the chip. The computing unit 47 calculates the voltage of the absolute reference power supply 48 by means of table-lookup based on the value of the temperature. The detection device of this exemplary embodiment does not need a dedicated indicator, thereby reducing the occupying resource needed for the chip.

An approximate value of the absolute reference power supply 48 may be obtained using the temperature compensation method. Then, a compensation voltage can be obtained by means of table-lookup. This, in turn, may provide an accurate voltage value of the absolute reference power supply 48, which is more accurate than the approximate value.

Figure 8:
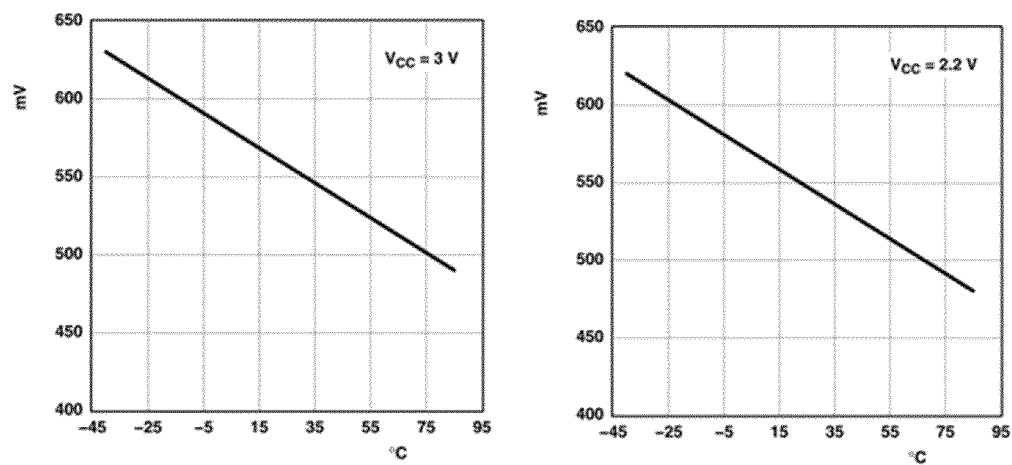
FIG. 8 illustrates lines graphs of voltage (in millivolts) versus temperature (in degrees Celsius) for an absolute reference power supply of the device shown in FIG. 7 when the voltage of the power supply is respectively 3 volts and 2.2 volts.

FIG. 8 shows voltage and temperature diagrams for the absolute reference power supply 48 when the voltage of power supply is respectively 3 volts and 2.2 volts. The voltage of the absolute reference power supply 48 can be worked out at first by means of table-lookup. Then, the voltage of the power supply can be calculated using formula (5).

Figure 9:
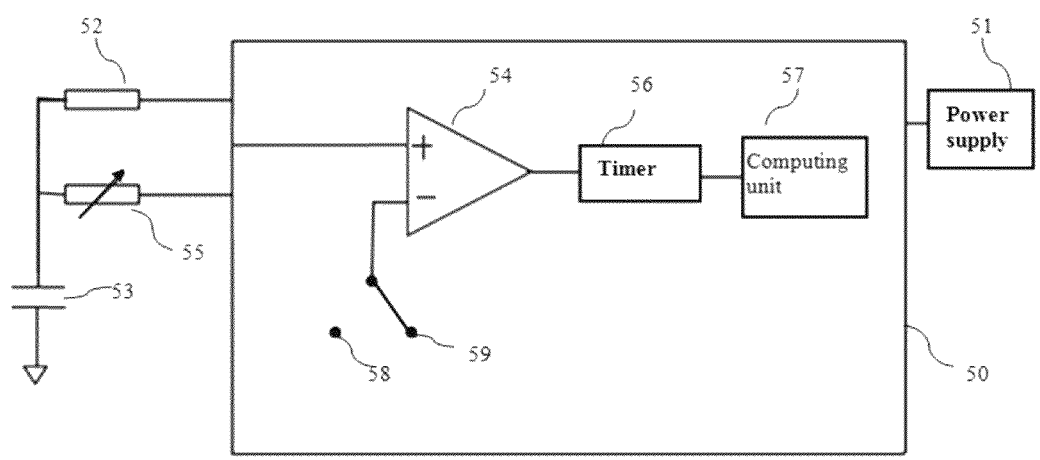
FIG. 9 illustrates a detection device for measuring voltage and temperature according to another exemplary embodiment of the present disclosure.

Exemplary embodiments of the present disclosure also provide detection devices for measuring voltage and temperature. For example, FIG. 9 shows an exemplary embodiment of a detection device for measuring voltage and temperature embodying one or more aspects of the present disclosure. In this exemplary embodiment, the detection device may include similar components as the device shown in FIG. 2 or FIG. 4 and FIG. 7.

As shown in FIG. 9, the detection device in this exemplary embodiment also includes a thermistor 55 connected to the capacitor 53. The detection device for measuring temperature has the function of measuring temperature. The device can also measure the voltage of the power supply 51.

The control unit 50 measures the voltage of the power supply 51 or the temperature of outside environment by controlling the capacitor 53 to discharge through the resistor 52 or the thermistor 55 after the capacitor is fully charged.

When the capacitor 53 begins to discharge after it is fully charged, the control unit 50 controls the capacitor 53 to discharge through the resistor 52, and the timer 56 starts timing. When the voltage across the capacitor 53 is equal to the voltage of the reference power supply, the timer 56 records a third time interval. Here, the reference power supply can be the absolute reference power supply 58 or the relative reference power supply 59. The control unit 50 controls the comparator 54 via a switch to connect to either the absolute reference power supply 58 or the relative reference power supply 59.

When the capacitor 53 is fully charged and begins to discharge, the control unit 50 controls the capacitor 53 to discharge through the thermistor 55, and the timer 56 starts timing. When the voltage across the capacitor 53 is equal to the voltage of the reference power supply, the timer 56 records a fourth time interval.

Figure 10:
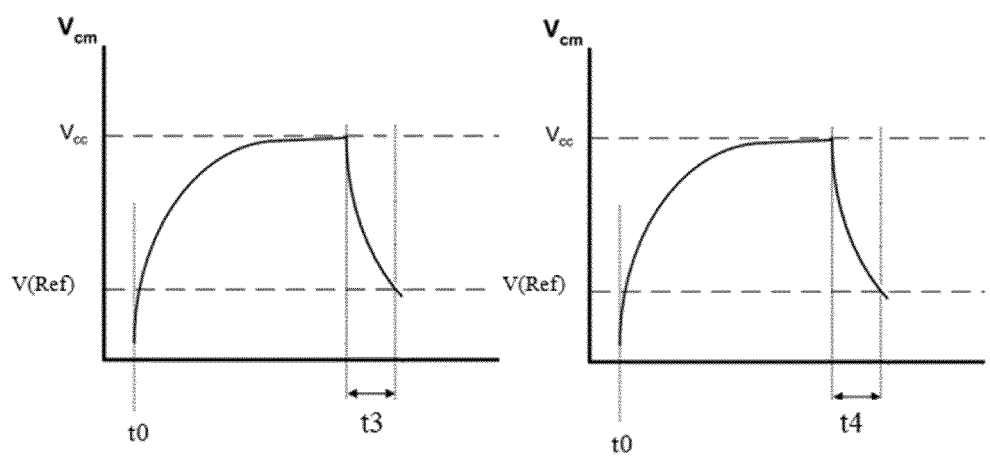
FIG. 10 illustrates waveform figure graphs of charging and discharging of the capacitor of the device shown in FIG. 9.

FIG. 10 shows a waveform of the capacitor 53 in its two processes of charging and discharging. The computing unit 57 calculates the resistance (R2) of the thermistor based on the third time interval (t3), the fourth time interval (t4), and the resistance (R1) of the resistor, where t3/t4=R1/R2 such that the resistance (R2) of the thermistor 55 is R2=R1*t4/t3.

Further, the chip can get the temperature of the environment by means of table-lookup.

Figure 11:
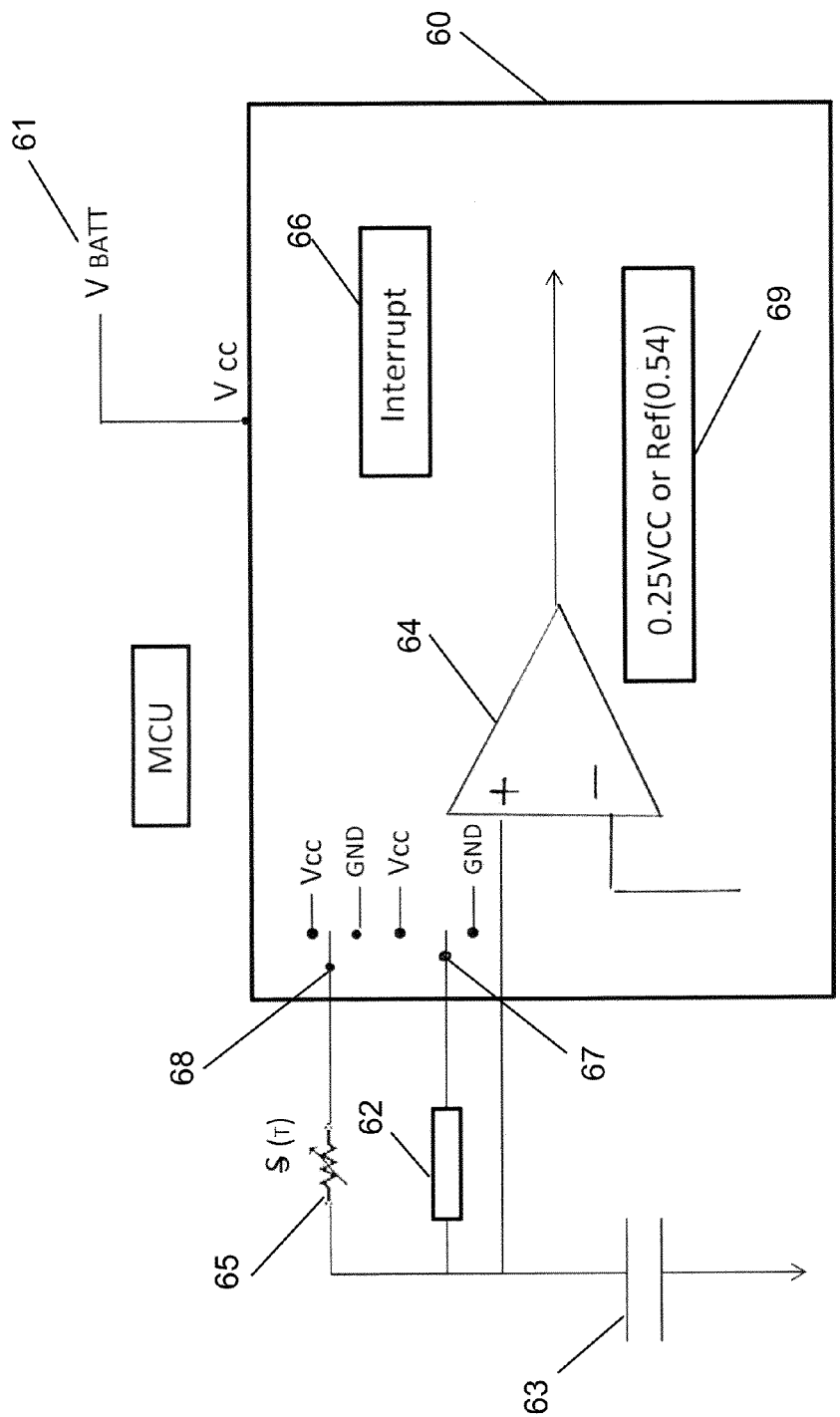
FIG. 11 illustrates a device for measuring voltage of a battery using a thermistor and dual slope technique according to another exemplary embodiment of the present disclosure.

FIG. 11 illustrates a device for measuring voltage of a battery using a thermistor and dual slope technique according to another exemplary embodiment of the present disclosure. In this exemplary embodiment, the device may include similar components (e.g., computing unit, timer, etc.) as the devices disclosed above and shown in FIGS. 2, 4, 7, and/or 9.

As shown in FIG. 11, the device includes a resistor 62, a capacitor 63, a variable resistor or thermistor 65, and a control unit 60. In this example, the control unit 60 comprises a microprogrammed control unit (MCU). One end of the capacitor 63 is connected with the resistor 62, the thermistor 65, and a comparator 64. The other end of the capacitor 63 is connected to ground. The control unit 60 is connected with the battery 61.

Also shown in FIG. 11 are an interrupt 66, switches 67 and 68, and a reference power supply 69. The switch 67 is controllable by the control unit 60 to connect the resistor 62 to ground or to Vcc (voltage of the power supply). The switch 68 is controllable by the control unit 60 to connect the thermistor 65 to ground or to Vcc (voltage of the power supply).

In this exemplary embodiment, the battery voltage level may be determined using the same comparator circuit that is used to determine temperature using a dual slope method. Using the same comparator circuit to determine temperature and battery voltage level eliminates the need for the microprocessor to have a built-in supply voltage monitor function. Accordingly, it is thus possible to use a less costly microprocessor that doesn't include a built-in supply voltage monitor function.

This exemplary embodiment uses the same circuit to sense the battery level as it does to sense the thermistor voltage for determining temperature through the use of a lookup table listing temperatures as a function of voltage level as disclosed herein. Although the circuit may mostly be used to determine temperature, the circuit may instead be used to determine battery level when the control unit 60 switches the resistor in the circuit from the thermistor 65 for temperature sensing to the fixed resistor 62 for measuring the battery voltage.

Exemplary embodiments of the present disclosure also provide temperature controllers. In an exemplary embodiment, a temperature measurement module of the temperature controller can provide the temperature. The voltage of the absolute reference power supply can be obtained by means of table-lookup. Then, the voltage of the power supply can be obtained by means of the comparator and the timer in the temperature measurement module. Such arrangement enables the temperature measurement module to measure the temperature and voltage of a power supply. Advantageously, a dedicated indicator is not necessary or required to measure the voltage of the power supply inside the chip, which, thus allows for reduced resource and cost of the chip.

Exemplary embodiments disclosed herein may be used in and/or are applicable to a variety of electronic products. When a circuit disclosed herein is applied in a temperature controller, the voltage of the absolute reference power supply may be calculated according to the external environment temperature detected by the temperature controller.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A device for measuring voltage of a power supply, the device comprising:
   a resistor;
   a capacitor having one end connected with the resistor and another end connected to ground; and
   a control unit connected with the power supply, the control unit including a comparator connected with the capacitor, a reference power supply connected with the comparator, a timer, and a computing unit;

wherein the reference power supply includes an absolute reference power supply and a relative reference power supply;

wherein the control unit is operable for controlling the comparator to connect to the absolute reference power supply or the relative reference power supply, such that:

when the control unit controls the comparator to connect to the relative reference power supply, the timer is operable for measuring a first time interval between the time when the voltage of the capacitor begins to discharge after being fully charged and the time when the voltage across the capacitor is equal to the voltage of the relative reference power supply; or when the control unit controls the comparator to connect to the absolute reference power supply, the timer is operable for measuring a second time interval between the time when the voltage of the capacitor begins to discharge after being fully charged and the time when the voltage across the capacitor is equal to the voltage of the absolute reference power supply;

wherein the computing unit is operable for calculating the voltage of the power supply based on the first time interval, the second time interval, and the voltage of the absolute reference power supply.

2. The device of claim 1, wherein:

when the comparator is connected to the relative reference power supply, the voltage of the power supply is a multiple of the voltage of the relative reference power supply, such that:

$Vcc = aVcc/\text{EXP}(-t1/RC)$ where $a$ is a constant and $0 < a < 1$;

$RC = -t1/\ln(a)$;

when the control unit controls the comparator to connect to the absolute reference power supply:

$Ez = Vcc^*\text{EXP}(-t2/RC)$;

$Vcc = Ez/\text{EXP}(t2^*\ln(a)/t1)$;

wherein Ez is the voltage of the absolute reference power supply, Vcc is the voltage of the power supply, t1 is the first time interval, t2 is the second time interval, R is the resistance of the resistor, and C is the capacitance of the capacitor.

3. The device of claim 1, wherein the first time interval and the second time interval are acquired in two sequential cycles during which the capacitor discharges.

4. The device of claim 1 for measuring voltage and temperature, wherein the device further comprises a thermistor connected to the capacitor.

5. The device of claim 4, wherein the control unit is operable for controlling the capacitor to discharge through the resistor or the thermistor when the capacitor is fully charged and begins to discharge, and for measuring the voltage of the power supply or the temperature of outside environment.

6. The device of claim 5, wherein:

the control unit is operable for controlling the capacitor to discharge through the resistor, whereby the timer measures a third time interval between the time when the capacitor begins to discharge after being fully charged and the time when the voltage across the capacitor is equal to the voltage of the reference power supply;

the control unit is operable for controlling the capacitor to discharge through the thermistor, whereby the timer measures a fourth time interval between the time when the capacitor begins to discharge after being fully charged and the time when the voltage across the capacitor is equal to the voltage of the reference power supply;

the computing unit is operable for calculating the resistance of the thermistor based on the third time interval, the fourth time interval, and the resistance of the resistor; and the computing unit is operable for further determining the temperature of the outside environment based on the resistance of the thermistor.

7. The device of claim 6, wherein the computing unit is operable for calculating the voltage of the absolute reference power supply based on the value of the temperature of the outside environment.

8. The device of claim 1, wherein the device is a temperature controller.

9. A detection device for measuring voltage of a power supply and temperature, the detection device comprising:

a resistor;

a capacitor having one end connected with the resistor and another end connected to ground;

a thermistor connected to the capacitor;

a control unit connected with the power supply, the control unit including a comparator connected with the capacitor, a reference power supply connected with the comparator, a timer, and a computing unit;

wherein the reference power supply includes an absolute reference power supply and a relative reference power supply;

wherein the control unit is operable for controlling the comparator to connect to the absolute reference power supply or the relative reference power supply, such that:

when the control unit controls the comparator to connect to the relative reference power supply, the timer is operable for measuring a first time interval between the time when the voltage of the capacitor begins to discharge after being fully charged and the time when the voltage across the capacitor is equal to the voltage of the relative reference power supply; or when the control unit controls the comparator to connect to the absolute reference power supply, the timer is operable for measuring a second time interval between the time when the voltage of the capacitor begins to discharge after being fully charged and the time when the voltage across the capacitor is equal to the voltage of the absolute reference power supply;

wherein the control unit is operable for controlling the capacitor to discharge through the resistor, whereby the timer measures a third time interval between the time when the capacitor begins to discharge after being fully charged and the time when the voltage across the capacitor is equal to the voltage of the reference power supply;

wherein the control unit is operable for controlling the capacitor to discharge through the thermistor, whereby the timer measures a fourth time interval between the time when the capacitor begins to discharge after being fully charged and the time when the voltage across the capacitor is equal to the voltage of the reference power supply;

wherein the computing unit is operable for calculating the resistance of the thermistor based on the third time interval, the fourth time interval, and the resistance of the resistor; and wherein the computing unit is operable for further determining the temperature of the outside environment based on the resistance of the thermistor;

wherein the computing unit is operable for calculating the voltage of the absolute reference power supply based on the value of the temperature of the outside environment; and wherein the computing unit is operable for calculating the voltage of the power supply based on the first time interval, the second time interval, and the voltage of the absolute reference power supply.

10. The device of claim 9, wherein the device is a temperature controller.

* * * * *